(12) United States Patent
Drewes

(10) Patent No.: US 7,189,583 B2
(45) Date of Patent: Mar. 13, 2007

(54) METHOD FOR PRODUCTION OF MRAM ELEMENTS

(75) Inventor: Joel A. Drewes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/610,823

(22) Filed: Jul. 2, 2003

(65) Prior Publication Data

US 2005/0003561 A1    Jan. 6, 2005

(51) Int. Cl.
*H03L 21/00* (2006.01)
(52) U.S. Cl. .................................. 438/3; 257/E21.665
(58) Field of Classification Search .................... 438/3; 365/171, 173; 428/694, 332; 360/319, 321, 360/324.11, 327.3; 369/13.25, 13.27; 257/295, 257/E21.665
See application file for complete search history.

(56) References Cited

U.S. PATENT DOCUMENTS

| 3,019,125 | A | * | 1/1962 | Lloyd et al. ................. 428/167 |
| 4,287,225 | A | * | 9/1981 | Kneller et al. .............. 427/599 |
| 4,455,626 | A | * | 6/1984 | Lutes .......................... 365/158 |
| 4,604,176 | A | * | 8/1986 | Paul ....................... 204/192.34 |
| 5,431,969 | A | * | 7/1995 | Mallary ....................... 427/599 |
| 5,436,047 | A | * | 7/1995 | Howard et al. ............ 428/64.2 |
| 5,482,785 | A | * | 1/1996 | Mahvan et al. ............. 428/611 |
| 5,585,198 | A | * | 12/1996 | Maeda et al. ............... 428/611 |
| 5,640,343 | A | * | 6/1997 | Gallagher et al. .......... 365/171 |
| 5,680,091 | A | * | 10/1997 | Maeda et al. ............. 338/32 R |
| 5,691,864 | A | * | 11/1997 | Saito ....................... 360/327.32 |
| 5,700,593 | A | * | 12/1997 | Okumura et al. ...... 428/694 TS |
| 5,738,929 | A | * | 4/1998 | Maeda et al. ............... 428/141 |
| 5,989,674 | A | * | 11/1999 | Marinero et al. .......... 428/65.3 |
| 6,127,053 | A | * | 10/2000 | Lin et al. ..................... 428/692 |
| 6,169,303 | B1 | * | 1/2001 | Anthony ...................... 257/295 |
| 6,248,395 | B1 | * | 6/2001 | Homola et al. ............. 427/129 |
| 6,292,389 | B1 | * | 9/2001 | Chen et al. .................. 365/158 |
| 6,351,339 | B1 | * | 2/2002 | Bar-Gadda .................... 360/55 |
| 6,430,085 | B1 | * | 8/2002 | Rizzo ........................ 365/173 |
| 6,511,761 | B1 | * | 1/2003 | Tanahashi et al. ..... 428/694 TS |
| 6,511,855 | B2 | * | 1/2003 | Anthony ......................... 438/3 |
| 6,625,058 | B2 | * | 9/2003 | Iwasaki ...................... 365/171 |
| 6,649,423 | B2 | * | 11/2003 | Anthony et al. ............... 438/3 |
| 6,661,703 | B1 | * | 12/2003 | Ikeda ......................... 365/158 |
| 6,667,118 | B1 | * | 12/2003 | Chang et al. ........ 428/694 TM |
| 6,740,397 | B1 | * | 5/2004 | Lee ............................ 428/332 |
| 6,833,573 | B1 | * | 12/2004 | Worledge .................. 257/295 |
| 2002/0127436 | A1 | * | 9/2002 | Shibamoto et al. .... 428/694 TS |
| 2004/0115481 | A1 | * | 6/2004 | Pelhos et al. ............ 428/694 T |
| 2004/0161577 | A1 | * | 8/2004 | Umezawa et al. ......... 428/65.3 |

OTHER PUBLICATIONS

Glang, R. and Maissel, L.I., Handbook of Thin Film Technology, McGraw-Hill, 1970, pp. 17-40, 17-41.*
Park et al., Growth-induced uniaxial in-plane magetic anisotropy for ultrathin Fe deposited on MgO(001) by oblique-incidence molecular beam epitaxy, *Appl. Phys. Lett.*, 66 (Apr. 1995) 2140.*

(Continued)

*Primary Examiner*—Bradley K. Smith
(74) *Attorney, Agent, or Firm*—Dickstein Shapiro LLP

(57) ABSTRACT

Magneto-resistive random access memory elements include a ferromagnetic layer having uniaxial anisotropy provided by elongate structures formed in the ferromagnetic film. The magnetic dipole aligns with the long axis of each structure. The structures can be formed in a variety of ways. For example, the ferromagnetic film can be applied to a seed layer having a textured surface. Alternatively, the ferromagnetic film can be stressed to generate the textured structure. Chemical mechanical polishing also can be used to generated the structures.

39 Claims, 3 Drawing Sheets

OTHER PUBLICATIONS

McMichael et al., Strong anisotropy in thin magnetic films deposited on obliquely sputtered Ta underlayers, *J. Appl. Phys.*, 88 (Nov. 2000) 5296.*

Sekiba et al., Uniaxial magnetic anisotropy tuned by nanoscale ripple formation: ion-sculpting of Co/Cu(001) thin films, *Appl. Phys. Lett.*, 84 (Feb. 2004) 762.*

De Wit et al., Induced Anisotropy of Amorphous CoFeSiB and CoNbZr Magnetic Materials, *IEEE Trans. Magnetics*, 23 (Sep. 1987) 2123.*

Cho et al., Effect of Seed Layer on the Magnetoresistance Characteristics in a-CoNbZr-Based Spin Valves, *IEEE Trans. Magnetics*, 34 (Jul. 1998) 1414.*

Tegen et al., Effect of Néel coupling on magnetic tunnel junctions, *J. Appl. Phys.*, 89 (Jun. 2001) 8169.*

Pietambaram et al., Exchange Coupling Control and Thermal Endurance of Syntheic Antiferromagnet Structures for MRAM, *IEEE Trans. Magnetics*, 40 (Jul. 2004) 2619.*

Merriam-Webster's Collegiate Dictionary Tenth Edition 1998 p. 45.*

Bottom-Up Approach in SI Technology Based on Surface Structure Design, pp. 992-1001, Electrochemical Society Proceedings vol. 2002-2, T. Ogino, et al., NTT Basic Research Laboratories.

* cited by examiner

METHOD FOR PRODUCTION OF MRAM ELEMENTS

BACKGROUND OF THE INVENTION

1. Field of the Invention

The invention relates to methods of producing magnetoresistive elements, and more particularly, to methods of producing magnetoresistive elements having an induced secondary anisotropy.

2. Description of the Related Art

Storage memories of various types are used extensively in digital systems such as microprocessor-based systems, digital processing systems, and the like. Recently, magnetic random access memory (MRAM) devices have been investigated for possible use in non-volatile random access memory. Information is stored in MRAM devices based on a magnetoresistive effect, in which memory cells formed of ferromagnetic layers in the device have resistances that change based on the magnetized state of a free ferromagnetic layer compared to that of a pinned (fixed) ferromagnetic layer. The magnetic moment of the pinned layer remains fixed while the magnetic moment of the free layer can change depending on an externally-applied magnetic field or potential. The relative magnetic directions of the free layer to the pinned layer typically are referred to as "parallel" and "antiparallel."

A magnetic memory element, such as a magnetic tunnel junction (MTJ), is formed on a wafer substrate. The structure includes free and pinned ferromagnetic layers separated by a non-magnetic tunnel junction barrier. The magnetic memory elements are formed using thin-film materials and can be manufactured on the sub-micron level.

In response to parallel and antiparallel magnetic states, the magnetic memory element represents two different resistances to a current provided across the memory element in a direction perpendicular to the plane of the ferromagnetic layers. The tunnel barrier is sufficiently thin that quantum-mechanical tunneling of charge carriers occurs across the barrier junction between the two separated sets of ferromagnetic layers. The resistance across the element has minimum and maximum values corresponding to whether the magnetization vectors of the free and pinned layers are parallel or antiparallel.

Consequently, it is necessary when producing magnetic memory elements to provide layers having magnetic moments that are selectively aligned. Magnetic memory element structures include very thin layers, also known as ultrathin films, some of which are tens of angstroms or less in thickness. The structure of ultrathin films has a strong influence on their magnetic properties. Small variations in thickness and surface morphology can impact the magnetic characteristics of an ultrathin magnetic film layer.

Magnetic anisotropy, the tendency of the magnetic moments in the layer to align in a given direction, can be influenced by the shape of the layer. Magnetic moments tend to align head to tail, rather than head to head, so by forming a layer as a rectangle, for example, the magnetic moments will tend to align parallel to the longer dimension of the layer. This phenomenon is known as shape-induced anisotropy. It would be advantageous to be able to induce anisotropy without regard to the overall shape of the film layer.

It is known in the prior art to form layer shapes using photolithography. Photolithography is susceptible, however, to image distortion and instabilities, problems that are exacerbated at the sub-micron level at which magnetic memory elements are being manufactured. It would be advantageous to be able to induce magnetic anisotropy in layers of a magnetic memory element by methods other than photolithography, which methods are accurate and reproducible at the sub-micron level of production.

BRIEF SUMMARY OF THE INVENTION

The present invention overcomes the problems in the prior art by providing induced uniaxial anisotropy rather than shape anisotropy to generate preferential alignment in submicron MRAM elements.

According to a preferred embodiment, the invention relies on preferential patterning or roughening of the starting substrate surface, which patterning translates to magnetic alignment within the MRAM structure itself. The magnetic moments of ferromagnetic films produced according to the present invention will align preferentially along grooves or patterns generated in the starting surface. By generating very fine surface patterns, anisotropy is induced independent of the overall shape of the element, even if the element is circular or symmetric. This method allows control of the anisotropy or switching field to be generated by processes which are more reliable than photoimaging.

Various methods can be used to create the anisotropy-inducing features. Grooves or patterns can be generated in a seed layer or a magnetic layer by masking the surface and etching. According to another embodiment, the patterns also can be generated by stressing the films on the surface and allowing them to relax and form ripples in a deposited film. Additionally, chemical mechanical polishing (CMP) can be used to generate surface texture. Other techniques include nano-fabrication methods such as self-assembly, self-organization, and nano-patterning.

Texturing an underlayer (seed layer) currently is preferred as the easiest and most repeatable method for inducing a secondary anisotropy in a magnetic film. This can be accomplished by utilizing off axis angular deposition which creates ripples by generating shadow effects as the film grows. The geometry and roughness that induce the anisotropy are controlled by deposition angle and thickness, which are very easy to repeat in a deposition system.

DETAILED DESCRIPTION OF THE INVENTION

Figure 1:
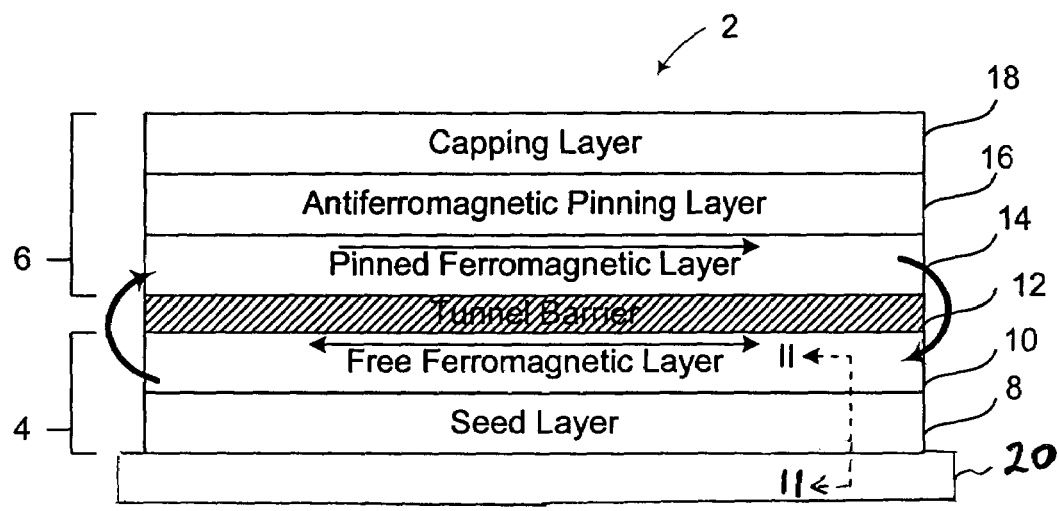
FIG. 1 illustrates a magnetic tunnel junction structure according to an exemplary embodiment of the present invention.

A generalized, exemplary magneto-resistive element structure 2 is shown in FIG. 1. The structure includes a free stack 4 and a pinned stack 6 formed above a substrate 20. Free stack 4 includes a seed layer 8 on which is disposed a free ferromagnetic layer 10. Above free stack 4 is pinned stack 6, separated by a tunnel barrier layer 12. Pinned stack 6 is made up of a pinned ferromagnetic layer 14, an antiferromagnetic pinning layer 16, and a capping layer 18. Other arrangements can be used. For example, the free and pinned ferromagnetic layers 10 and 14 may each be formed as a plurality of stacked individual layers. The stacks also can include offset control and coupling layers.

Figure 2:
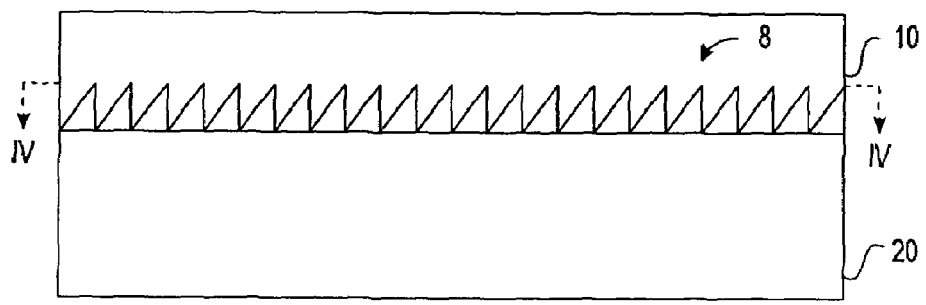
FIG. 2 is a cross-sectional illustration taken along the line II—II in FIG. 1 of a portion of the film stack shown in which secondary anisotropy is imparted to a ferromagnetic layer according to an exemplary embodiment of the present invention.
Figure 4:
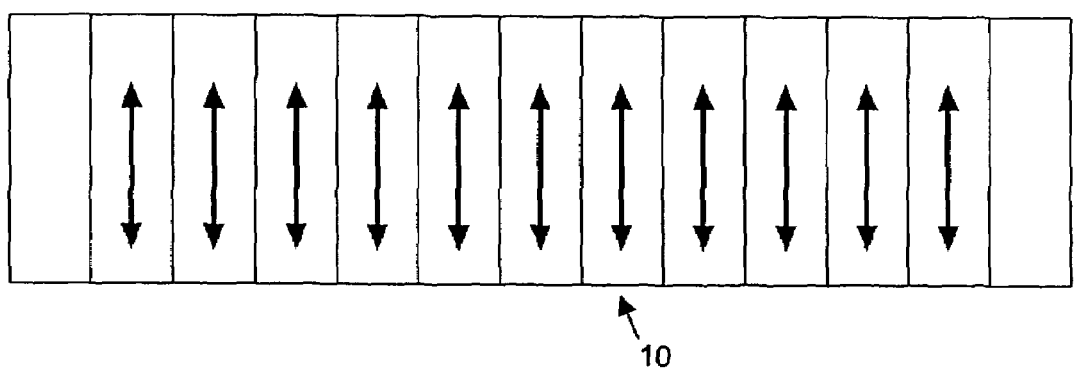
FIG. 4 is a plan view of the planes IV—IV in FIGS. 2 and 3 schematically illustrating secondary anisotropy imparted to a ferromagnetic layer in the film stack.

FIG. 2 shows a partial cross-section of film stack 2 taken along the line II—II in FIG. 1. As illustrated in FIG. 2, seed layer 8 provided above substrate 20 is textured. The texture of the seed layer 8 imparts uniaxial anisotropy in ferromagnetic film 10 grown above seed layer 8. Alignment of the magnetic moments in ferromagnetic film 10 is illustrated in FIG. 4, described further below.

The seed layer 8 can be textured by various methods known in the art, including patterning and etching, off-axis deposition, in which thin films are deposited at an angle not perpendicular to the substrate, dimple etching, or by chemical mechanical polishing (CMP), for example. In a representative CMP process, an oxide slurry having a neutral pH is applied with pressure to a substrate. The presence of oxide in the slurry and the physical pressure lead to micro-scratches in the surface. Polishing is carried out so that the micro-scratches are aligned to impart the unixial anisotropy to the deposited ferromagnetic film layer 10.

In addition, various nanofabrication techniques can be utilized to impart texture to seed layer 8. In general, nanofabrication techniques include lithographic techniques using ultraviolet light, X-rays, ion beams, and electron beams; scanning probe techniques for nano-patterning, (scanning tunneling microscopy (STM) and atomic force microscopy (AEM); and self-assembly or self-organization of nanostructures. Examples of the latter include quantum dots and quantum wires. See T. Ogino et al., "Bottom-up approach in Si technology based on surface structure design," Electrochemical Society Proceedings, Vol. 2002-2, p. 992–1001, the entire disclosure of which is incorporated herein by reference.

Figure 3:
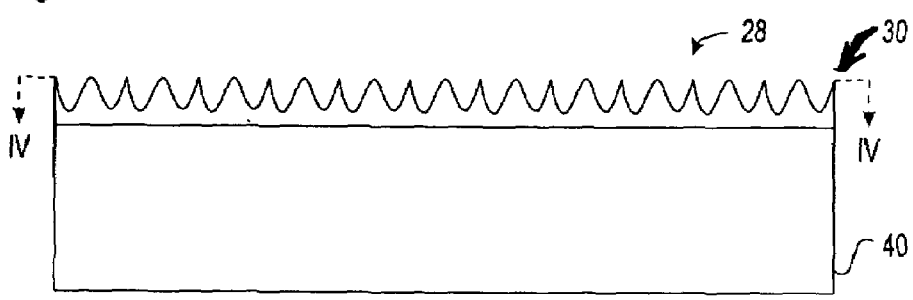
FIG. 3 illustrates an exemplary embodiment of the present invention in which aligning structures are formed directly in a ferromagnetic film supported on a substrate.

According to an alternative method of the invention, aligning structures 28 are formed more directly in a ferromagnetic film 30, shown supported on a substrate 40 in FIG. 3. The aligning structures are formed by stressing film 30, applying tensile or compressive force, for example. Alternatively, aligning structures can be formed in the ferromagnetic film by applying techniques discussed above in connection with forming aligning structures in the seed layer directly to the ferromagnetic film layer. FIG. 4 is a view of the ferromagnetic film 30 taken as indicated by line IV—IV in FIG. 3 illustrating schematically the direction of anisotropic alignment of the structures.

According to an alternative method of the invention, aligning structures 28 are formed more directly in a ferromagnetic film 30, shown supported on a substrate 40 in FIG. 3. The aligning structures are formed by stressing film 30, applying tensile or compressive force, for example. Alternatively, aligning structures can be formed in the ferromagnetic film by applying techniques discussed above in connection with forming aligning structures in the seed layer directly to the ferromagnetic film layer.

FIG. 4 depicts the magnetic dipole alignment in ferromagnetic film 10 along the trenches or long axis of any structures or textures formed in the ferromagnetic films 10 or 30.

Figure 5:
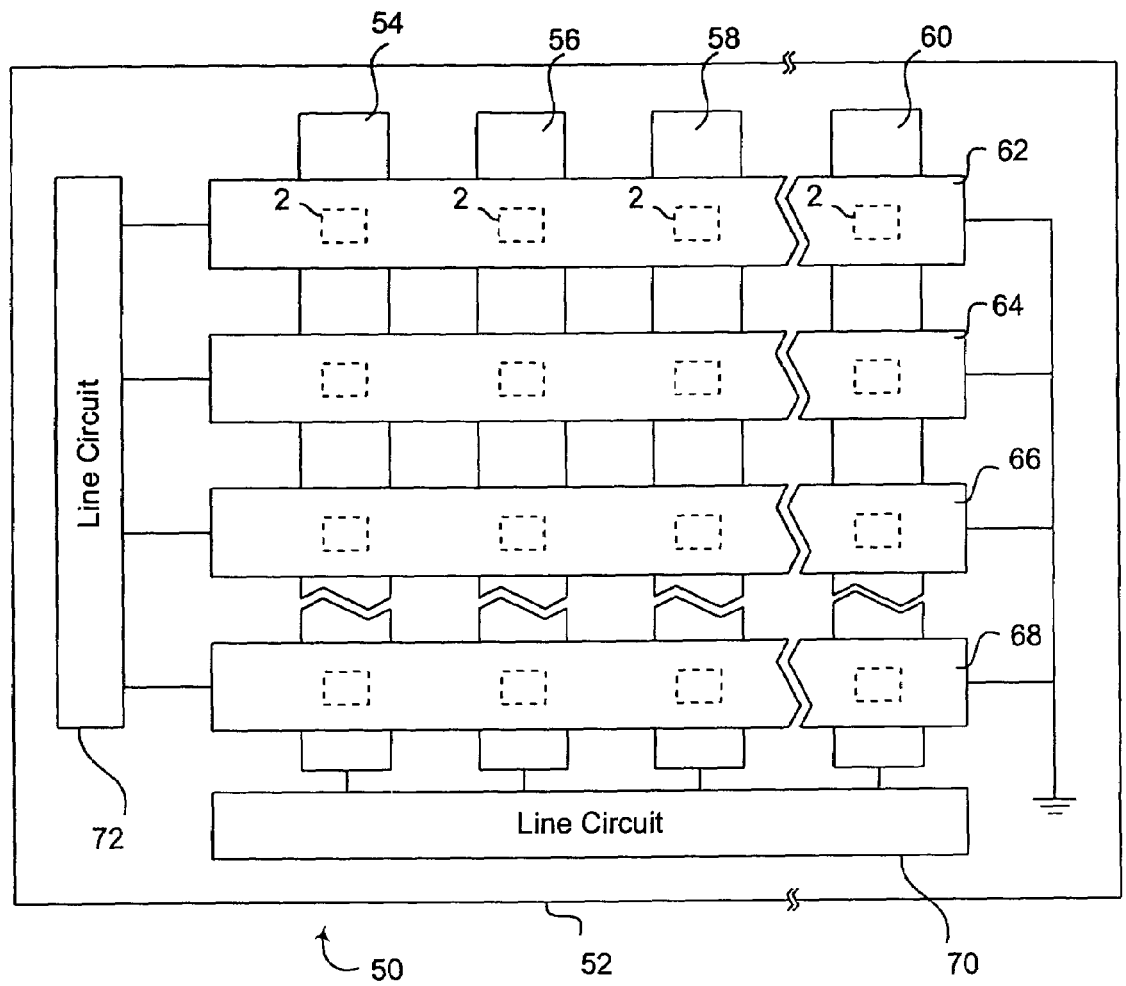
FIG. 5 illustrates an MRAM array according to an exemplary embodiment of the present invention.

FIG. 5 illustrates an MRAM including an array made up of magneto-resistive memory elements 2. MRAM array 50 is formed over a substrate 52 and includes column lines 54, 56, 58, and 60, and row lines 62, 64, 66, and 68. Columns and rows are selected by column and row line circuits 70 and 72, respectively. At the intersection of each column and row line is an MTJ memory element 2 fabricated in accordance with the invention.

Figure 6:
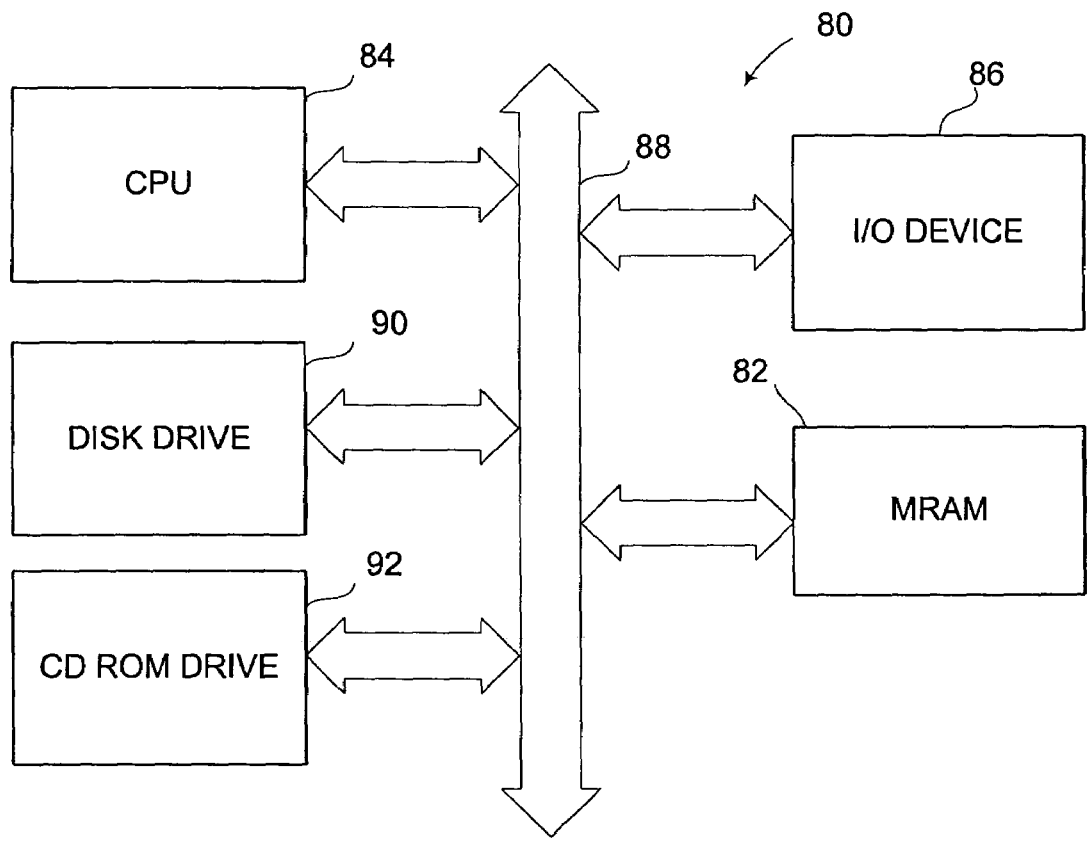
FIG. 6 illustrates a microprocessor-based system including an MRAM according to an exemplary embodiment of the present invention.

FIG. 6 illustrates a microprocessor-based system that includes an MRAM containing an MRAM array made up of magneto-resistive memory elements 2. FIG. 6 illustrates a processor system 80 in which an MRAM 82 according to the present invention may be utilized. System 80 includes a CPU 84 and a user input/output (I/O) device 86 connected to a system bus 88. System 80 also includes MRAM 82 which communicates with the CPU 84 over system bus 88. Other peripheral devices include a disk drive 90 and a CD ROM drive 92.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A method for producing a magnetic memory cell comprising:
    forming a ferromagnetic film within a magneto-resistive film stack of the magnetic memory cell; and
    imparting a physical texture, triangular in shape, to a surface of the ferromagnetic film, thereby generating in the ferromagnetic film uniaxial magnetic anisotropy aligned with and induced by the physical texture imparted to the surface of the ferromagnetic film.

2. A method as in claim 1, wherein the physical texture includes a plurality of aligned ridges.

3. A method as in claim 2, wherein the aligned ridges are substantially mutually parallel.

4. A method as in claim 1, wherein the physical texture is imparted by forming the ferromagnetic film on a seed layer having a physically textured surface.

5. A method as in claim 4, wherein the physical texture is imparted by patterning and etching.

6. A method as in claim 4, wherein the physical texture is imparted by chemical mechanical polishing.

7. A method as in claim 4, wherein the physical texture is imparted by depositing a thin film on a wafer surface at an oblique angle to the wafer surface.

8. A method as in claim 7, wherein the physical texture is imparted to a thin film.

9. A method as in claim 8, wherein the thin film is either a dielectric or a metal.

10. A method as in claim 1, wherein the physical texture is imparted by applying a ferromagnetic film to a substrate, and stressing the ferromagnetic film.

11. A method as in claim 1, wherein uniaxial magnetic anisotropy generated in the ferromagnetic film consists essentially of that induced by the physical texture imparted to the surface of the ferromagnetic film.

12. A method as in claim 1, wherein the ferromagnetic film is formed in a free film stack of the magneto-resistive memory cell.

13. A magneto-resistive cell structure comprising a magneto-resistive film stack comprising a ferromagnetic film having uniaxial magnetic anisotropy induced by and aligned with a physical surface texture having an angular shape imparted to the ferromagnetic film, wherein the angular shape comprises a first sidewall perpendicular to the ferromagnetic film and a second sidewall sloped from the ferromagnetic film to intersect with a top end of the first sidewall.

14. A magneto-resistive cell structure as in claim 13, wherein the physical surface texture is imparted by generating a physically textured seed layer, and applying the ferromagnetic film to the textured seed layer.

15. A magneto-resistive cell structure as in claim 14, wherein the physically textured seed layer is generated by patterning and etching.

16. A magneto-resistive cell structure as in claim 14, wherein the physically textured seed layer is generated by depositing a thin film on a substrate at an oblique angle to the surface of the substrate.

17. A magneto-resistive cell structure as in claim 14, wherein the physically textured seed layer comprises either a dielectric or a metal.

18. A magneto-resistive cell structure as in claim 13, wherein the physical surface texture is a series of elongate surface inequalities.

19. A magneto-resistive cell structure as in claim 18, wherein the series of elongate surface inequalities includes a pattern of alternating parallel ridges and channels.

20. A magneto-resistive cell structure as in claim 13, wherein the physical surface texture is imparted by applying the ferromagnetic film to a substrate, and stressing the film.

21. A magneto-resistive cell structure as in claim 13, wherein the physical surface texture is imparted to the ferromagnetic film as a plurality of substantially parallel, elongate trenches.

22. A magnetic memory cell comprising:
 a substrate supporting a magneto-resistive memory cell, comprising:
  a seed layer imparted with a patterned surface texture having an angular shape and disposed on the substrate, wherein the angular shape comprises a first sidewall perpendicular to the substrate and a second sidewall sloped from the substrate to intersect with a top end of the first sidewall and
  a ferromagnetic film layer formed on the seed layer and having taken on the patterned surface texture of the seed layer to thereby acquire uniaxial magnetic anisotropy aligned with the patterned surface texture of the ferromagnetic film layer.

23. A magnetic memory cell as in claim 22, the magneto-resistive memory cell comprising a pinned ferromagnetic stack.

24. A method of manufacturing a magnetic memory comprising forming an array of magneto-resistive memory cells, each magneto-resistive memory cell being formed from a ferromagnetic film having uniaxial magnetic anisotropy induced by and aligned with a physical surface texture having an angular shape imparted to a surface of the ferromagnetic film, wherein the angular shape comprises a first sidewall perpendicular to the ferromagnetic film and a second sidewall sloped from the ferromagnetic film to intersect with a top end of the first sidewall.

25. A method as in claim 24, wherein the physical surface texture includes a plurality of aligned ridges.

26. A method as in claim 25, wherein the aligned ridges are substantially mutually parallel.

27. A method as in claim 24, wherein the physical surface texture is imparted by forming the ferromagnetic film on a textured surface of a seed layer.

28. A method as in claim 27, wherein texture on the textured surface of the seed layer is generated by patterning and etching a surface of the seed layer.

29. A method as in claim 27, wherein texture on the textured surface of the seed layer is generated by chemical mechanical polishing.

30. A method as in claim 27, wherein texture on the textured surface of the seed layer is generated by depositing a thin film on a wafer surface at an oblique angle to the wafer surface.

31. A method as in claim 30, wherein the textured surface of the seed layer is formed in a thin film.

32. A method as in claim 31, wherein the thin film is either a dielectric or a metal.

33. A method as in claim 24, wherein the physical surface texture is imparted by applying a ferromagnetic film to a substrate, and stressing the ferromagnetic film.

34. A magnetic memory comprising an array of individual magneto-resistive memory cells having a substrate, a seed layer disposed on the substrate, a physical texture formed on the surface of the seed layer, and a ferromagnetic film layer formed on the seed layer so that a surface of the ferromagnetic film layer takes on the physical texture formed on the surface of the seed layer and thereby acquires uniaxial magnetic anisotropy, wherein the physical texture is triangular in shape.

35. A microprocessor-based system comprising a magnetic memory including an array of individual magneto-resistive memory cells having a substrate, a seed layer disposed on the substrate, a physical texture imparted to the surface of the seed layer, and a ferromagnetic film layer formed on the seed layer so a surface of the ferromagnetic film layer takes on the physical texture imparted to the surface of the seed layer and thereby acquires uniaxial magnetic anisotropy, wherein the physical texture is triangular in shape.

36. A magneto-resistive random access memory comprising a plurality of magneto-resistive memory cells, each magneto-resistive memory cell comprising a ferromagnetic film having elongate structures in the ferromagnetic film and a magnetic dipole induced by physical surface texturing comprising a plurality of ridges and valleys of the elongate structures aligned with a long axis of each elongate structure, wherein the physical surface texturing is triangular in shape.

37. A magneto-resistive random access memory as in claim 36, wherein the elongate structures are formed in the film in a regular, repeating pattern.

38. A magneto-resistive random access memory as in claim 36, wherein the elongate structures are formed by forming the ferromagnetic layer on a textured underlayer.

39. A magneto-resistive random access memory as in claim 36, wherein the elongate cell structures are formed by stressing the ferromagnetic film.

* * * * *

UNITED STATES PATENT AND TRADEMARK OFFICE
CERTIFICATE OF CORRECTION

PATENT NO. : 7,189,583 B2
APPLICATION NO. : 10/610823
DATED : March 13, 2007
INVENTOR(S) : Joel A. Drewes Page 1 of 1

It is certified that error appears in the above-identified patent and that said Letters Patent is hereby corrected as shown below:

Title page under Column 1, Other Publications portion of the References Cited section, the following error is corrected:

"Park et al., Growth-induced uniaxial in-plane magetic anisotropy for ultrathin Fe deposited on MgO(001) by oblique-incidence molecular beam epitaxy, *Appl. Phys. Lett.*, 66 (Apr. 1993) 2140."

Should read

--Park et al., Growth-induced uniaxial in-plane magnetic anisotropy for ultrathin Fe deposited on MgO(001) by oblique-incidence molecular beam epitaxy, *Appl. Phys. Lett.*, 66 (Apr. 1993) 2140.--.

In the Specification, following errors are corrected:

Column 2, line 25, "photoiimaging" should read --photoimaging--; and

Column 3, line 40, "(AEM)" should read --(AFM)--.

At column 3, line 47, insert the following:

--The textured seed layer may be a dielectric, metal, or other thin film that would impart controlled morphology to the ferromagnetic film. Typically, the surface texture features are tens of microns in length, and a few nanometers to a few tenths of nanometers in width and depth.--.

Delete lines 59-67 in column 3.

Signed and Sealed this

Twelfth Day of June, 2007

JON W. DUDAS
*Director of the United States Patent and Trademark Office*